United States Patent
Pulsford et al.

(10) Patent No.: US 6,538,874 B2
(45) Date of Patent: Mar. 25, 2003

(54) ELECTRONIC DEVICE

(75) Inventors: Nicolaas Jonathan Pulsford, Nijmegen (NL); Jozef Thomas Martinus Van Beek, Eindhoven (NL)

(73) Assignee: Koninklijke Philips Electronics N.V., Eindhoven (NL)

(*) Notice: Subject to any disclaimer, the term of this patent is extended or adjusted under 35 U.S.C. 154(b) by 0 days.

(21) Appl. No.: 09/782,664

(22) Filed: Feb. 13, 2001

(65) Prior Publication Data

US 2002/0006024 A1 Jan. 17, 2002

(30) Foreign Application Priority Data

Feb. 15, 2000 (EP) .............................. 00200496

(51) Int. Cl.[7] .............................................. H01G 4/30
(52) U.S. Cl. ............................ 361/301.4; 361/308.1; 361/311; 333/172
(58) Field of Search ...................... 361/301.2–301.4, 361/306.1–306.3, 309, 311–313, 320, 321.1–321.5; 333/172; 257/306

(56) References Cited

U.S. PATENT DOCUMENTS 4,951,175 A * 8/1990 Kurosawa et al. .......... 257/303
5,508,881 A * 4/1996 Stevens ................... 346/135.1
5,731,747 A * 3/1998 Van De Walle et al. .... 333/172

OTHER PUBLICATIONS

"Technology For Passive Integration", by M. De Samber et al., Philips Journal of Research, vol. 51, No. 3, 1998.

* cited by examiner

Primary Examiner—Dean A. Reichard
Assistant Examiner—Eric Thomas
(74) Attorney, Agent, or Firm—Steven R. Biren

(57) ABSTRACT

An electronic device having a resonance frequency with a margin of error sufficiently small for high frequency applications. The electronic device includes a first capacitor electrode in a first electrically conducting layer, a dielectric including a layer of dielectric material and a distinct electrically insulating material, and a second capacitor electrode in a second electrically conducting layer.

20 Claims, 1 Drawing Sheet

ELECTRONIC DEVICE

BACKGROUND OF THE INVENTION

The invention relates to an electronic device provided with a first coil and a first capacitor which has a first and a second capacitor electrode and a dielectric, which device comprises a substrate with a first and a second side, at which second side the following are present:

- a first electrically conducting patterned layer in which the first capacitor electrode is defined,
- a layer of dielectric material which constitutes at least in part the dielectric, and
- a second electrically conducting patterned layer comprising a first pattern which is substantially the first coil and a second pattern which is at least a portion of the second capacitor electrode.

Such a device is known from M. de Samber & L. Tegelaers, *Philips Journal of Research*, 51 (1998), 389–410. The known device is an LC filter. The substrate comprises silicon with an electrically insulating surface of $SiO_2$ at the second side. The first electrically conducting layer comprises aluminum. The second electrically conducting layer may comprise aluminum and gold. If this layer comprises aluminum, the layer was provided by means of sputtering and subsequent etching. A second electrically conducting patterned layer of gold is manufactured in that a resist layer is provided on a thin gold layer, the resist layer is structured by means of photolithography, and the gold is electrochemically grown.

A disadvantage of the known device is that the LC filter has a resonance frequency having a margin of error owing to uncontrollable steps in the manufacture of the device. This margin of error is too great for high-frequency applications of the device.

SUMMARY OF THE INVENTION

It is a first object of the invention to provide an electronic device of the kind mentioned in the opening paragraph which has a resonance frequency with a margin of error which is sufficiently small for applications of the device at high frequencies.

This object is achieved in that:
- the dielectric has a middle zone and edge zones parallel to the second side of the substrate,
- the dielectric has a greater dielectric thickness in the edge zones than in the middle zone, and
- a perpendicular projection of the second capacitor electrode onto the first electrically conducting layer lies at least partly within the first capacitor electrode.

The resonance frequency of the first order is equally strongly dependent on the inductance of a coil present and on the capacitance of a capacitor present. Owing to the greater dielectric thickness—defined as the ratio of the thickness of the layer to the dielectric constant—an increase in the inductance owing to a badly controllable step in the manufacture of the device is compensated by a decrease in the capacitance in that same step in the manufacture. The badly controllable step usually is the patterning of the second electrically conducting layer, because this layer preferably has a comparatively great thickness. This patterning may take place, for example, through wet or dry etching or in a process in which a pattern is electrochemically enhanced. A similar compensation may occur if the inductance decreases: the capacitance then increases.

It is necessary in the case of a varying capacitance that a perpendicular projection of the second capacitor electrode onto the first electrically conducting layer lies at least partly within the first capacitor electrode. The perpendicular projection need not lie entirely within the first capacitor electrode; an electrically conducting connection from the second electrode to other parts of the device, such as the first coil, may be present in the second electrically conducting layer. The compensation may also require that the perpendicular projection lies only partly within the first capacitor electrode. Preferably, the ratio of the dielectric thickness in the edge zones to that in the middle zone lies between 3 and 20.

The result is that the resonance frequency of the device is not influenced by the error tolerances in the manufacture of the device. The device, which may be not just an LC filter, but also, for example, an integrated circuit provided with a coil and a capacitor, is suitable for application in RF cordless communication products such as mobile telephones which operate at frequencies above 100 MHz. The use of the electronic device according to the invention in a high-frequency application renders it possible to adjust the frequency with a more accurate bandwidth. The high-frequency application thus has a better performance. It is also possible to use very high frequencies, such as frequencies of more than 2000 MHz.

In a favorable embodiment
- the dielectric in the middle zone is built up from the layer of dielectric material, and
- the dielectric in the edge zones is built up from the layer of dielectric material and a layer of electrically insulating material.

The difference in dielectric thickness between the edge zones and the middle zone can be greater owing to the combination of the layer of dielectric material and the layer of electrically insulating material in the edge zones than if only the layer of dielectric material were present.

In another embodiment of the device according to the invention
- an electrically conducting patterned intermediate layer is present between the layer of dielectric material and the layer of electrically insulating material, in which intermediate layer a planar conductor track is defined which is in electrical contact with the second pattern of the second electrically conducting layer and forms the second capacitor electrode in conjunction with this pattern, and
- a perpendicular projection of said second pattern onto the intermediate layer lies at least partly outside the conductor track.

In this embodiment, the layer of dielectric material is present between the layer of electrically insulating material and the first electrically conducting layer. This has the advantage that the layer of dielectric material and the intermediate layer were deposited consecutively and that the boundary surface between these layers is not influenced by etching means. The intermediate layer serves as an etch stop layer during etching of the layer of electrically insulating material, the latter lying partly on the intermediate layer and partly on the layer of dielectric material.

In a specific modification of the above embodiment, the layers of dielectric material and electrically insulating material are locally absent outside the first capacitor, and an electrically conductive connection is present between the first and the second electrically conducting layer. Such a connection is known as a via. The modified embodiment has the advantage that it can be manufactured without additional steps in the manufacturing method. Etching of the layer of electrically insulating material outside the first capacitor, where no intermediate layer is present, at the same time removes the layer of dielectric material. The subsequent deposition of the second electrically conducting layer then completes the via.

It is favorable, furthermore, when the second electrically conducting layer has a thickness greater than 5 μm. The losses of the first coil are small in the case of such a thickness.

Preferably, the second electrically conducting layer comprises aluminum. This material is easy to provide by sputtering and can be patterned through wet etching. Underetching takes place in this case, which causes the capacitance of the first capacitor to decrease, while the inductance of the first coil increases. Furthermore, aluminum has a good conductivity. This is important not only for the coil but also for the conductor tracks or interconnects, which are preferably defined in the second electrically conducting layer.

The first electrically conducting layer comprises, for example, aluminum, doped poly(3,4-ethylenedioxy) thiophene, polyaniline, nickel, copper, gold, platinum, or doped silicon.

The material of the substrate may be chosen from a large number of materials. Examples are glass, alumina, polyimide, and silicon. Preferably, high-ohmic silicon, which is oxidized to silicon oxide at the second side, is chosen on account of the high-frequency application.

Preferably, the dielectric material is a material having a high dielectric constant. Examples are silicon nitride, substituted barium titanate and barium niobate, tantalum oxide, and polyvinylphenol. Preferably, the electrically insulating material is a material having a low dielectric constant such as silicon oxide, polyimide, benzocyclobutene. The electrically insulating material may possibly be patterned by means of photolithography.

BRIEF DESCRIPTION OF THE DRAWINGS

These and other aspects of the invention will be explained in more detail with reference to drawings, in which.

DESCRIPTION OF THE PREFERRED EMBODIMENTS

Embodiment 1

Figure 1:
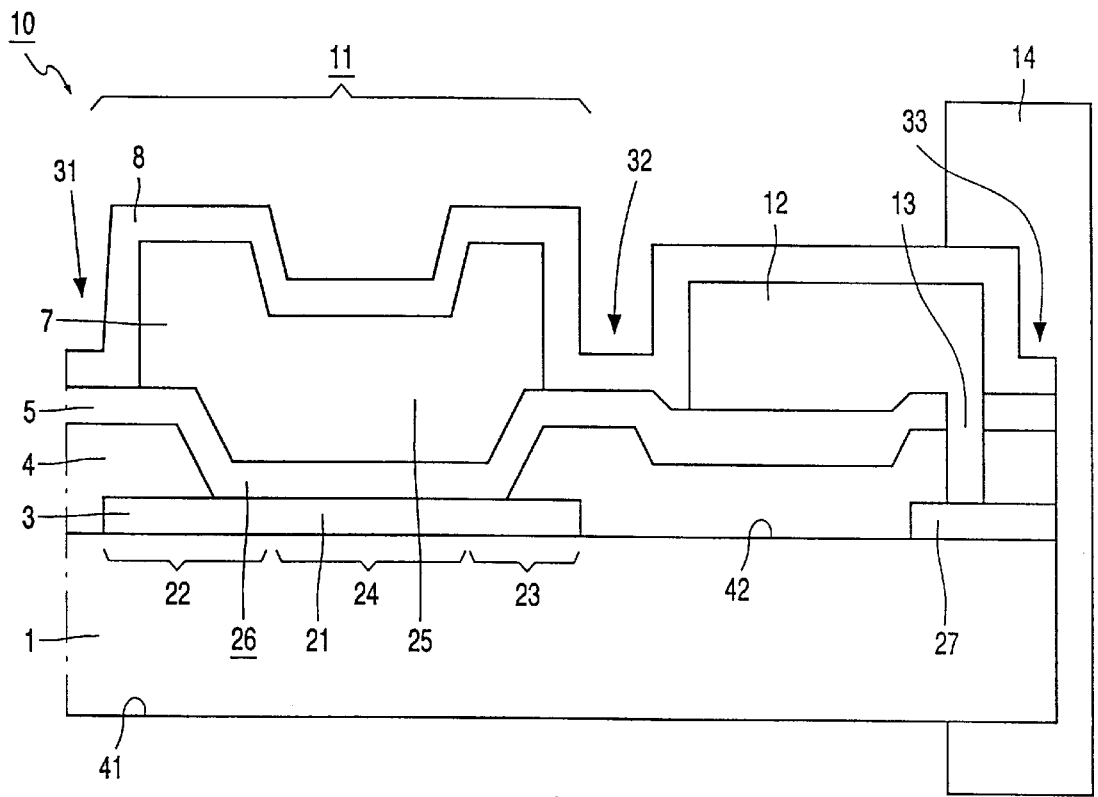
FIG. 1 is a diagrammatic side elevation of a first embodiment of the device according to the invention.

The LC filter 10 in FIG. 1 has a substrate 1 of $Al_2O_3$ with a fist side 41 and a second side 42, of the substrate 1, there is a first electrically conducting layer 3 of Ni in which a first capacitor electrode 21 is defined. Also present in the first electrically conducting layer 3 is a conductor track 27 which connects a via 13—and thereby inter alia a first coil 12—to a U-shaped electrical contact 14. A dielectric 26 lies on the first capacitor electrode of the first capacitor 11. In the edge zones 22 and 23 of the capacitor 11, the dielectric 26 comprises a layer of dielectric material 5 of 0.01 to 0.2 μm thickness and a layer of electrically insulating material 4 of 0.1 to 0.8 μm thickness. The dielectric 26 comprises the layer of dielectric material 5 in the middle zone 24 of the capacitor 11. The dielectric material is $BaNdTiO_3$. The electrically insulating material is $SiO_x$, $1 \leq x \leq 2$. A second electrically conducting layer 7 of Al is present on the layer of dielectric material 5. The second capacitor electrode 25 of the first capacitor 11, the first coil 12, and a vertical interconnect area (via) 13 are defined in this second electrically conducting layer 7, which has a thickness of 4 to 7 μm. The first coil 12 is the first pattern, the second capacitor electrode is the second pattern. A perpendicular projection of the second capacitor electrode 25 onto the first conducting layer 3 lies within the first electrode 21. The fact that underetching occurs during etching of holes 31, 32, and 33 in the second conducting layer 7 causes the surface area of the second capacitor electrode 25 to decrease, and thus also the capacitance value of the first capacitor 11. At the same time, the inductance value of the first coil 12 increases. The second conducting layer 7 is covered with a protective layer 8.

Embodiment 2

Figure 2:
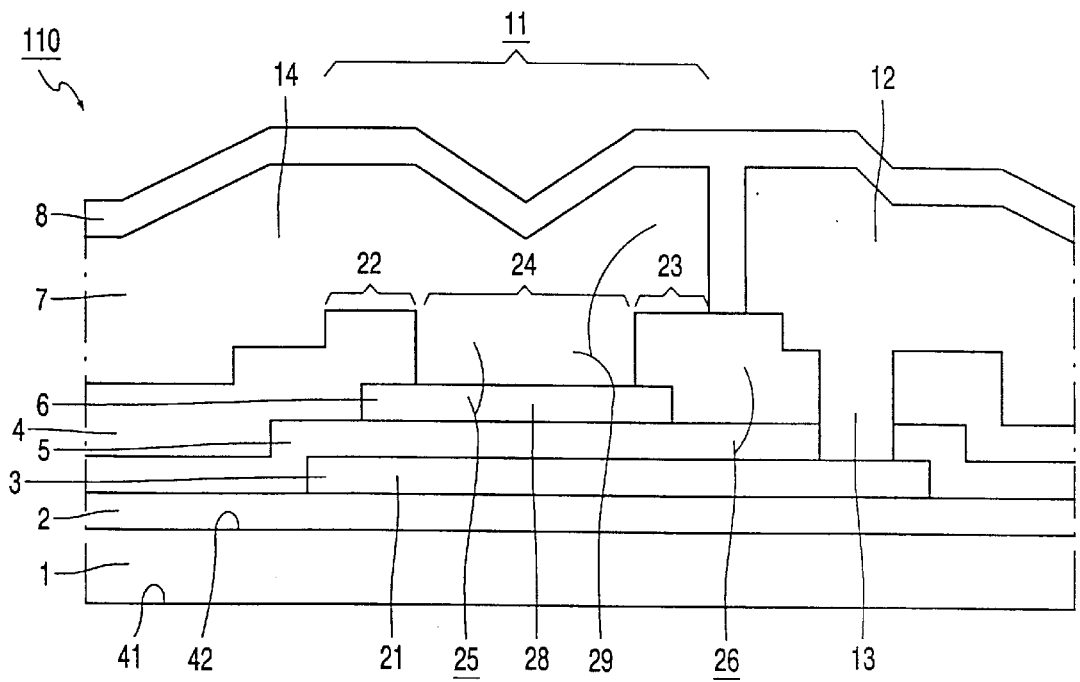
FIG. 2 is a diagrammatic side elevation of a second embodiment of the device according to the invention.

The electronic device 110 in FIG. 2 comprises a substrate 1 of silicon with a first side 41 and a second side 42. At the second side 42, the substrate 1 is covered with an electrically insulating layer 2 of silicon oxide. A first electrically conducting layer 3 of Al, in which a first capacitor electrode 21 of the first capacitor 11 is defined, is present on the layer 2. A layer of dielectric material 5, which is removed at the area of the via 13, lies on the first electrically conducting layer 3. The layer of dielectric material 5 comprises $SiN_x$, $0.5 \leq x \leq 2$, and constitutes the dielectric 26 in a middle zone 24 of the capacitor 11. In the edge zones 22 and 23, the dielectric 26 comprises not only the layer of dielectric material 5 but also a layer of electrically insulating material 4, in this example $SiO_x$, $1 \leq x \leq 2$. An intermediate layer 6 comprising Al lies on the layer of dielectric material 5 and is partly covered by the layer of electrically insulating material 4. A conductor track 28 is defined in the intermediate layer 6. A second pattern 29 of a second electrically conducting layer 7, also comprising Al, is in electrical contact with this conductor track 28. The conductor track 28 and the second pattern 29 together form the second capacitor electrode 25 of the first capacitor 11. The second conducting layer 7 in addition comprises a first coil 12 as a first pattern, a via 13, and an interconnect 14, and is covered with a protective layer 8. A perpendicular projection of the second pattern 29 onto the intermediate layer 6 lies partly outside the conductor track 28. A perpendicular projection of the second pattern 29 onto the first conducting layer 3 lies partly outside the first capacitor electrode 21, i.e. at the area of the interconnect 14. This interconnect 14 is necessary for connecting the second capacitor electrode 25 to other parts of the device 110. Hence, a perpendicular projection of the second capacitor electrode 25 onto the first conducting layer 3 lies at least partly inside the first capacitor electrode 21.

What is claimed is:

1. An electronic device having a coil and a capacitor, comprising:
    a substrate;
    a first electrically conducting patterned layer formed on the substrate, wherein a first capacitor electrode is defined in the first electrically conducting patterned layer;
    a dielectric formed on the first electrically conducting patterned layer, wherein the dielectric includes a layer of dielectric material and a distinct electrically insulating material; and
    a second electrically conducting patterned layer formed on the layer of dielectric material, wherein the second electrically conducting patterned layer comprises a first pattern which is substantially the coil and a second pattern which is at least a portion of a second capacitor electrode.

2. The device of claim 1, wherein the first electrically conducting patterned layer further comprises a conductor track connecting the coil to an electrical contact.

3. The device of claim 1, further comprising an electrically conducting patterned intermediate layer formed between the layer of dielectric material and the insulating material, wherein the intermediate layer defines a planar conductor track that is in electrical contact with the second electrically conducting patterned layer.

4. The device of claim 1, wherein the layer of dielectric material comprises $BaNdTiO_3$.

5. The device of claim 1, wherein the electrically insulating material comprises $SiO_x$, and wherein $1 \leq x \leq 2$.

6. The device of claim 1, wherein the layer of dielectric material and the electrically insulating material are locally absent outside the capacitor, and an electrically conductive connection is present between the first electrically conducting patterned layer and the second electrically conducting patterned layer.

7. The device of claim 1, wherein the second electrically conducting layer has a thickness greater that 5 $\mu$m and comprises aluminum.

8. The device of claim 1, wherein the device is used for a high-frequency application.

9. An electronic device having a coil and a capacitor, comprising:
   a substrate;
   a first electrically conducting patterned layer formed on the substrate, wherein a first capacitor electrode is defined in the first electrically conducting patterned layer;
   a dielectric formed on the first electrically conducting patterned layer;
   a second electrically conducting patterned layer formed on the dielectric, wherein the second electrically conducting patterned layer comprises a first pattern which is substantially the coil and a second pattern which is at least a portion of a second capacitor electrode; and
   a conductor track connecting the coil to an electrical contact.

10. The device of claim 9, wherein the dielectric comprises a layer of dielectric material and a distinct electrically insulating material.

11. The device of claim 9, wherein the layer of dielectric material comprises $BaNdTiO_3$.

12. The device of claim 9, wherein the electrically insulating material comprises $SiO_x$, and wherein $1 \leq x \leq 2$.

13. The device of claim 9, wherein the layer of dielectric material and the electrically insulating material are locally absent outside the capacitor, and an electrically conductive connection is present between the first electrically conducting patterned layer and the second electrically conducting patterned layer.

14. The device of claim 9, further comprising a perpendicular projection of the second capacitor electrode contacting the first electrically conducting patterned layer, wherein the projection lies are least partly within the first capacitor electrode.

15. The device of claim 9, wherein the second electrically conducting patterned layer has a thickness greater that 5 pm and comprises aluminum.

16. The device of claim 9, wherein the device is used for a high-frequency application.

17. An electronic device having a coil and a capacitor, comprising:
   a substrate;
   a first electrically conducting patterned layer formed on the substrate, wherein a first capacitor electrode is defined within the first electrically conducting patterned layer;
   a dielectric formed on the first electrically conducting patterned layer, wherein the dielectric includes a layer of dielectric material and a separate electrically insulating material, wherein the dielectric has a middle zone and opposing edge zones, and wherein the edge zones have a greater thickness than the middle zone;
   a second electrically conducting patterned layer formed on the dielectric, wherein the second electrically conducting patterned layer comprises a first pattern which is substantially the coil and a second pattern which is at least a portion of a second capacitor electrode;
   a perpendicular projection of the second capacitor electrode contacting the first electrically conducting patterned layer, wherein the projection lies are least partly within the first capacitor electrode; and
   an electrically conducting patterned intermediate layer formed between the dielectric material and the insulating material, wherein the intermediate layer defines a planar conductor track that is in electrical contact with the second electrically conducting patterned layer.

18. The device of claim 17, wherein the layer of dielectric material and the electrically insulating material are locally absent outside the capacitor, and an electrically conductive connection is present between the first conducting patterned layer and the second electrically conducting patterned layer.

19. The device of claim 17, wherein the second electrically conducting patterned layer has a thickness greater that 5 $\mu$m and comprises aluminum.

20. The device of claim 17, wherein the device is used for a high-frequency application.

* * * * *